United States Patent
Wittig et al.

(10) Patent No.: US 6,606,641 B1
(45) Date of Patent: Aug. 12, 2003

(54) SYSTEM FOR VARYING THE DYNAMIC RANGE OF COEFFICIENTS IN A DIGITAL FILTER

(75) Inventors: Karl Wittig, New York, NY (US); Gene Turkenich, Hillsdale, NJ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/062,941

(22) Filed: Apr. 20, 1998

(51) Int. Cl.[7] .......................... G06F 17/00; G06F 17/10
(52) U.S. Cl. .................. 708/319; 708/300; 708/301; 708/315; 708/322; 708/323; 708/400
(58) Field of Search ............................. 700/28, 32, 33, 700/37, 52, 54, 55, 73; 708/300, 301, 315, 319, 322, 400, 323

(56) References Cited

U.S. PATENT DOCUMENTS

| | | | | |
|---|---|---|---|---|
| 4,615,026 A | * | 9/1986 | Schiff ......................... 264/724 |
| 4,972,483 A | * | 11/1990 | Carey .......................... 381/31 |
| 5,029,121 A | * | 7/1991 | Kawata et al. ......... 364/724.16 |
| 5,029,217 A | * | 7/1991 | Chabries et al. ............ 381/68.2 |
| 5,079,734 A | * | 1/1992 | Riley ....................... 364/724.1 |
| 5,172,411 A | * | 12/1992 | Gazsi ......................... 379/402 |
| 5,216,589 A | * | 6/1993 | Shinnaka .................... 364/148 |
| 5,233,549 A | | 8/1993 | Chinn ........................ 364/724 |
| 5,339,264 A | | 8/1994 | Said et al. .................. 364/724 |
| 5,381,359 A | * | 1/1995 | Abbott et al. .......... 364/724.19 |
| 5,617,344 A | * | 4/1997 | Young et al. ............. 364/724.1 |
| 5,619,711 A | * | 4/1997 | Anderson .................... 395/800 |
| 5,802,399 A | * | 9/1998 | Yumoto et al. ............. 395/886 |
| 5,838,598 A | * | 11/1998 | Hurrell ................. 364/724.011 |
| 5,852,667 A | * | 12/1998 | Pan et al. ................... 381/71.1 |
| 5,854,756 A | * | 12/1998 | Willink .................. 364/724.16 |
| 5,867,065 A | * | 2/1999 | Leyendecker ................ 330/149 |
| 5,884,092 A | * | 3/1999 | Kiuchi et al. ........... 395/800.35 |
| 6,018,689 A | * | 1/2000 | Kumura et al. ............. 700/280 |
| 6,271,782 B1 | * | 8/2001 | Steensgaard-Madsen .... 341/143 |

FOREIGN PATENT DOCUMENTS

EP          0813301 A1        12/1997

OTHER PUBLICATIONS

PHA 23,373, U.S. Ser. No. 09/031,698, Filed: Feb. 27, 1998.

* cited by examiner

Primary Examiner—Hassan Kizou
Assistant Examiner—Joe Logsdon

(57) ABSTRACT

A digital filter includes a plurality of filter cells, each of which includes circuitry to determine a coefficient for the filter cell, to adjust the coefficient in accordance with a gain that is used by each of the plurality of filter cells, and to multiply input data by the adjusted coefficient in order to generate a filter cell output. An adder circuit generates a filter output by adding filter cell outputs from each of the plurality of filter cells, and an inverse gain circuit adjusts the filter output in accordance with an inverse of the gain used to adjust the coefficients of the plurality of filter cells.

20 Claims, 8 Drawing Sheets

SYSTEM FOR VARYING THE DYNAMIC RANGE OF COEFFICIENTS IN A DIGITAL FILTER

BACKGROUND OF THE INVENTION

1. Field of the Invention

The present invention is directed to a digital filter which varies the dynamic range of coefficients used therein in order to reduce the size of hardware required to implement the filter. In particular, the invention is directed to a digital filter which adjusts coefficients thereof in accordance with a filter gain, which multiplies each adjusted coefficient by input data and adds the resulting products, and which adjusts the sum of the products in accordance with an inverse of the filter gain.

2. Description of the Related Art

Conventional digital filters, such as finite impulse response (hereinafter "FIR") filters, are comprised of a plurality of filter cells, or "tap" cells, arranged in series. Each filter cell includes a data register for storing a sampled data value and a coefficient register which stores a coefficient for that particular cell. In operation, the same sampled data value is input sequentially to each filter cell, and is multiplied by a coefficient for that cell. The results of these multiplications are then output and combined in order to generate the filter's output. In certain types of digital filters, known as "adaptive" filters, adaptation circuit is also included in each filter cell, which is used to update the cell's coefficients based on a variety of factors, such as channel characteristics or the like, that could affect data transmission.

Problems arise in conventional digital filters due to the way in which such filters multiply the coefficients by the input data. More specifically, conventional digital filters, and in particular adaptive digital filters, often require relatively high bit precision. One way in which to obtain such precision is to use floating point arithmetic to effect the foregoing multiplication. However, floating point arithmetic can require excessive amounts of hardware to implement and can be relatively slow. As a result, floating point arithmetic has proven unsuitable for use in many digital filter applications.

Another way in which conventional digital filters obtain high bit precision is to perform the foregoing multiplication using coefficients that have a relatively large number of bits, i.e., coefficients that have a relatively large dynamic range. In order to process such large numbers of bits, however, these conventional digital filters require relatively large multiplier circuits. As a result, such digital filters also can be relatively large in size. This size constraint can be problematic, particularly in devices such as adaptive equalizers, which require tens or even hundreds of filter tap cells. Moreover, the size of the multiplier circuits used in this type of conventional digital filter also decreases the speed at which those filters operate.

Thus, there exists a need for a way to maintain high bit precision in a digital filter without significantly increasing the size and/or amount of circuitry used in the digital filter, and without significantly decreasing the speed of the digital filter.

SUMMARY OF THE INVENTION

The present invention addresses the foregoing need by providing a digital filter which adjusts coefficients in accordance with a gain prior to multiplying the coefficients by the input data. For example, in accordance with the invention, a coefficient whose magnitude has a binary representation of "00000111" can be adjusted to "111" by eliminating the first five zeros, without affecting the value of the coefficient. Using adjusted coefficients such as this, less bit precision is required during multiplication, thereby reducing the size of the multiplication circuit required to perform the multiplication, and increasing the speed at which the multiplication is performed. Moreover, in accordance with the invention, a filter output generated based on results of the multiplication is adjusted based on the inverse of the gain used to adjust the coefficients. As a result, high bit precision is maintained by the filter.

Thus, according to one aspect, the present invention is a digital filter that includes a plurality of filter cells, each of which includes circuitry to determine a coefficient for the filter cell, to adjust the coefficient in accordance with a gain that is used by each of the plurality of filter cells, and to multiply input data by the adjusted coefficient in order to generate a filter cell output. Also included in the digital filter are an adder circuit which generates a filter output by adding filter cell outputs from each of the plurality of filter cells, and an inverse gain circuit which adjusts the filter output in accordance with an inverse of the gain used to adjust the coefficients of the plurality of filter cells.

In preferred embodiments of the invention, the digital filter includes a gain control circuit to determine the gain based on a coefficient of the plurality of filter cells having a highest-order nonzero magnitude bit. In these embodiments of the invention, each of the plurality of filter cells includes a multiplier circuit to multiply the input data by the adjusted coefficient in order to generate the filter cell output, and the gain is determined so that the adjusted coefficient in each filter cell occupies an input range of the multiplier circuit for the filter cell. To this end, each of the plurality of filter cells includes a gain adjusting circuit which adjusts the coefficient for the filter cell by shifting bits comprising the coefficient such that a highest order nonzero magnitude bit of the coefficient is in a most significant bit position of an input to the multiplier circuit. By virtue of these features of the invention, it is possible to reduce the bit precision of the coefficient, e.g., by eliminating unnecessary zeros in the binary representation of the coefficient, and to thereby reduce the size of the multiplier circuit used during the multiplication described above.

In particularly preferred embodiments of the invention, the gain adjusting circuit comprises a barrel shifter which is implemented using a matrix of pass transistors. By implementing the barrel shifter using a matrix of pass transistors, the size of the barrel shifter can be reduced, thereby reducing the overall size of the digital filter even further.

According to another aspect, the present invention is a method of filtering input data using a digital filter comprised of a plurality of filter cells, where each of the plurality of filter cells generates a filter cell output based on input data and a coefficient. The method includes a coefficient determining step for determining a coefficient of each of the plurality of filter cells, a coefficient adjusting step for adjusting the coefficient of each filter cell in accordance with a gain that is used by each of the plurality of filter cells, and a multiplying step for multiplying input data in each filter cell by an adjusted coefficient so as to generate a filter cell output for each filter cell. The method also includes an adding step for adding filter cell outputs from each of the plurality of filter cells so as to generate a filter output, and an output adjusting step for adjusting the filter output in accordance with an inverse of the gain used to adjust the coefficients of the plurality of filter cells.

By adjusting the coefficient of each filter cell in accordance with a gain that is used by each of the plurality of filter cells, and then subsequently adjusting the filter output in accordance with an inverse of the gain used to adjust the coefficients, the invention is able to maintain bit precision of the filter without using excessive amounts of hardware to do so. Moreover, a digital filter which uses the method described above can be made smaller than, and can operate faster than, its conventional counterparts described above.

According to another aspect, the present invention is a digital filter which includes a first plurality of filter cells, each of which includes circuitry to determine a coefficient for the filter cell, to adjust the coefficient in accordance with a first gain that is used by each of the first plurality of filter cells, and to multiply input data by the adjusted coefficient in order to generate a first filter cell output. A first adder circuit generates a first output by adding first filter cell outputs from each of the first plurality of filter cells, and a first inverse gain circuit generates a first adjusted output by adjusting the first output in accordance with an inverse of the first gain used to adjust the coefficients of the first plurality of filter cells. Also included in the digital filter are a second plurality of filter cells, each of which includes circuitry to determine a coefficient for the filter cell, to adjust the coefficient in accordance with a second gain that is used by each of the second plurality of filter cells, and to multiply input data by the adjusted coefficient in order to generate a second filter cell output. A second adder circuit generates a second output by adding second filter cell outputs from each of the second plurality of filter cells, and a second inverse gain circuit generates a second adjusted output by adjusting the second output in accordance with an inverse of the second gain used to adjust the coefficients of the second plurality of filter cells. Finally, a third adder circuit adds the first adjusted output and the second adjusted output in order to generate a filter output for the digital filter.

By virtue of the foregoing features of the invention, it is possible to adjust different coefficients in different groups of filter cells differently, and thereby increase the overall precision of the filter.

According to still another aspect, the present invention is a digital filter which includes a plurality of filter cells, each of which includes circuitry to determine a plurality of coefficients for the filter cell, to adjust each of the plurality of coefficients in accordance with a gain that is used by each of the plurality of filter cells, and to multiply a corresponding data value input to the filter cell by a corresponding adjusted coefficient in order to generate a filter cell output. In the invention, an adder circuit generates a filter output by adding filter cell outputs from each of the plurality of filter cells, and an inverse gain circuit adjusts the filter output in accordance with an inverse of the gain used to adjust the coefficients of the plurality of filter cells.

Thus, the foregoing aspect of the invention combines resource sharing with varying coefficients' dynamic ranges. As a result, this aspect of the invention provides even further reductions in hardware, without sacrificing speed or bit precision.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION OF THE PREFERRED EMBODIMENTS

First Embodiment

Figure 1:
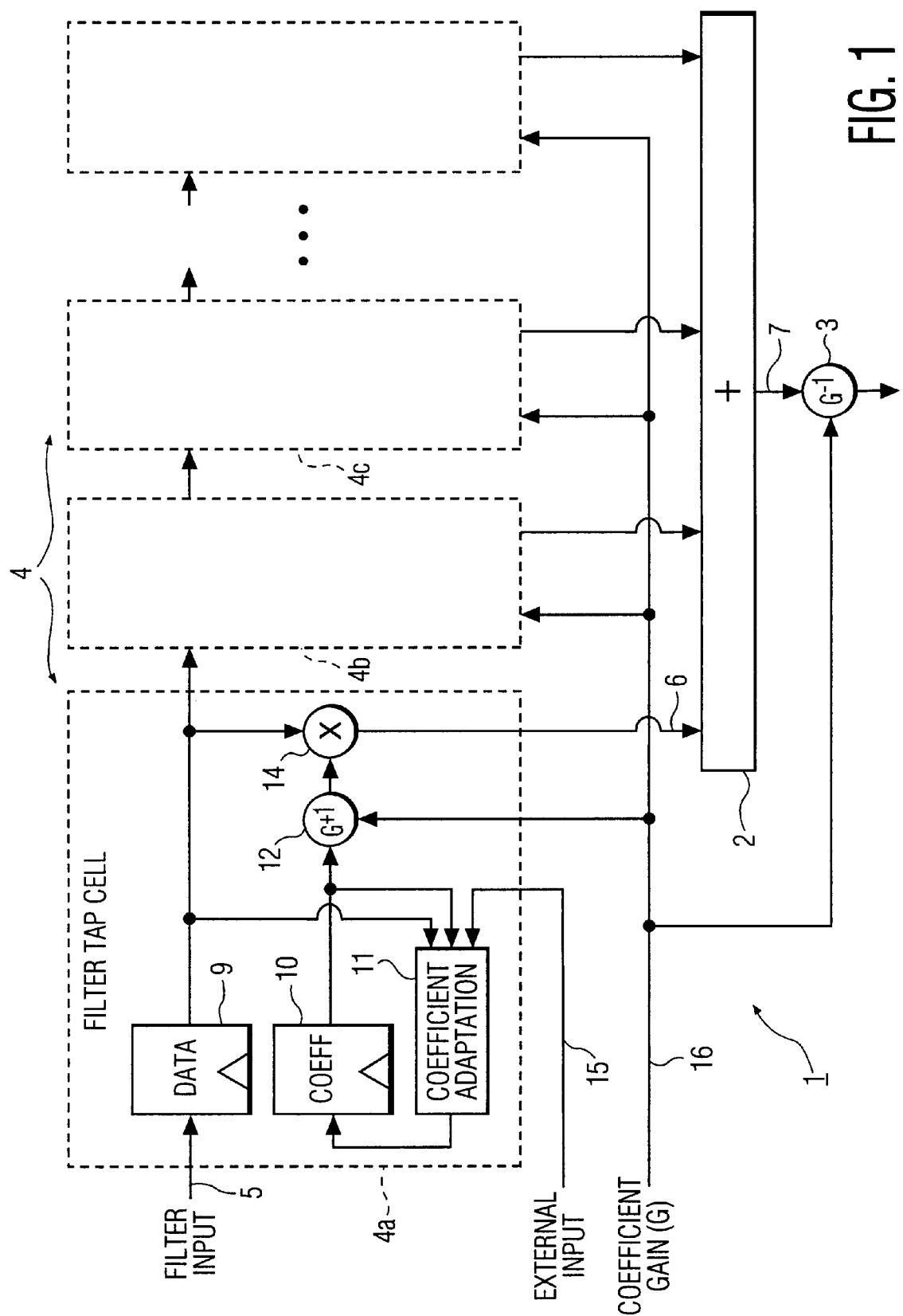
FIG. 1 is a functional block diagram showing an adaptive FIR filter in accordance with a first embodiment of the present invention.

Initially, it is noted that although the present invention can be used with different types of digital filters, the invention will be described in the context of an adaptive FIR filter. In this regard, FIG. 1 shows an example of an adaptive FIR filter which implements the present invention. As shown in FIG. 1, digital filter 1 includes adder circuit 2, inverse gain circuit 3, and a plurality of identical filter cells 4. Any number of these filter cells may be included in digital filter 1, depending upon the desired functionality of the filter.

Digital filter 1 operates by sampling data from a signal at a predetermined sampling rate, and sequentially shifting the sampled data, labeled 5 in FIG. 1, into each of filter cells 4 in accordance with a sampling clock signal. For example, sampled data 5 is shifted into filter cell 4a in response to a first sampling clock pulse. Next, when additional data is sampled at a next sampling clock pulse, that additional data is shifted into filter cell 4a, and the data already in filter cell 4a (i.e., sampled data 5) is shifted into filter cell 4b, and so on.

Each of filter cells 4 processes the sampled data within a single period of the sampling clock signal. As described below in more detail, this processing includes determining a coefficient for each of the plurality of filter cells, adjusting the coefficient of each filter cell in accordance with a gain that is used by each of the plurality of filter cells, and multiplying the sampled data input to each filter cell by an adjusted coefficient so as to generate a filter cell output, labeled 6 in FIG. 1, for each filter cell. After the sampled data has been processed by all of filter cells 4 in this manner, resulting filter cell outputs are provided to adder circuit 2. Adder circuit 2 combines filter cell outputs from each of filter cells 4 in order to generate filter output 7 for filter 1. Thereafter inverse gain circuit 3 adjusts filter output 7 in accordance with an inverse of the gain that was used to adjust the coefficients of filter cells 4, and outputs the result.

As shown in FIG. 1, filter cell 4a, which is identical in structure to the others of filter cells 4, includes data register 9, coefficient register 10, coefficient adaptation circuit 11, gain adjusting circuit 12, and multiplier circuit 14. Data register 9 receives an input data value from an external source (not shown), such as a data line or a previous filter cell. Coefficient register 10 stores a binary value of a coefficient used by the filter cell. Coefficient adaptation circuit 11 determines updated coefficient values and stores these updated coefficient values in coefficient register 10. More specifically, as noted above, filter cell 4a is an adaptive filter cell, meaning that a coefficient stored therein is updated periodically. Thus, a coefficient in filter cell 4a may be updated periodically to correct for unwanted changes in the input data value caused, e.g., by changes in a transmission channel used to transmit the data value, and/or to perform correction based on external input 15 which can comprise a filter error or the like.

Multiplier circuit 14 multiplies a data value output from data register 9 by a coefficient which has been adjusted by gain adjusting circuit 12. Specifically, gain adjusting circuit 12 adjusts a coefficient output from coefficient register 10 by applying a variable gain 16 thereto (e.g., by multiplying the coefficient by the gain). In this regard, multiplying a binary coefficient by a power of $2^N$ has the effect of shifting that binary coefficient left by "N" bits. Accordingly, gain 16 which, as described below, is a power of $2^N$, has the effect of shifting bits of the coefficient output from coefficient register 10 to the left. Preferably, this shift is such that a highest order nonzero magnitude bit (i.e., non-sign bit) of the coefficient is in a most significant bit position of an input to multiplier circuit 14, and such that the adjusted coefficient occupies a full dynamic range (i.e., an input range) of multiplier circuit 14.

By way of example, in a case that multiplier circuit 14 comprises an eight-bit multiplier and the coefficient for the cell has an unsigned bit representation of "0000000011001100", gain adjusting circuit 12 applies a gain which shifts bits of the coefficient so that the coefficient comprises "11001100". In this manner, gain adjusting circuit 12 eliminates eight unnecessary zeros from the coefficient. By doing this, the invention is able to replace a relatively large sixteen-bit multiplier circuit with a smaller, eight-bit multiplier circuit, without sacrificing multiplication accuracy. Moreover, since inverse gain circuit 3 adjusts filter output 7 in accordance with an inverse of the gain applied by gain adjusting circuit 12, in this example, the invention is able to maintain sixteen-bit precision. Specifically, the invention is able to maintain sixteen-bit precision by adding eight zeros to high order bit positions of filter output 7.

Figure 2:
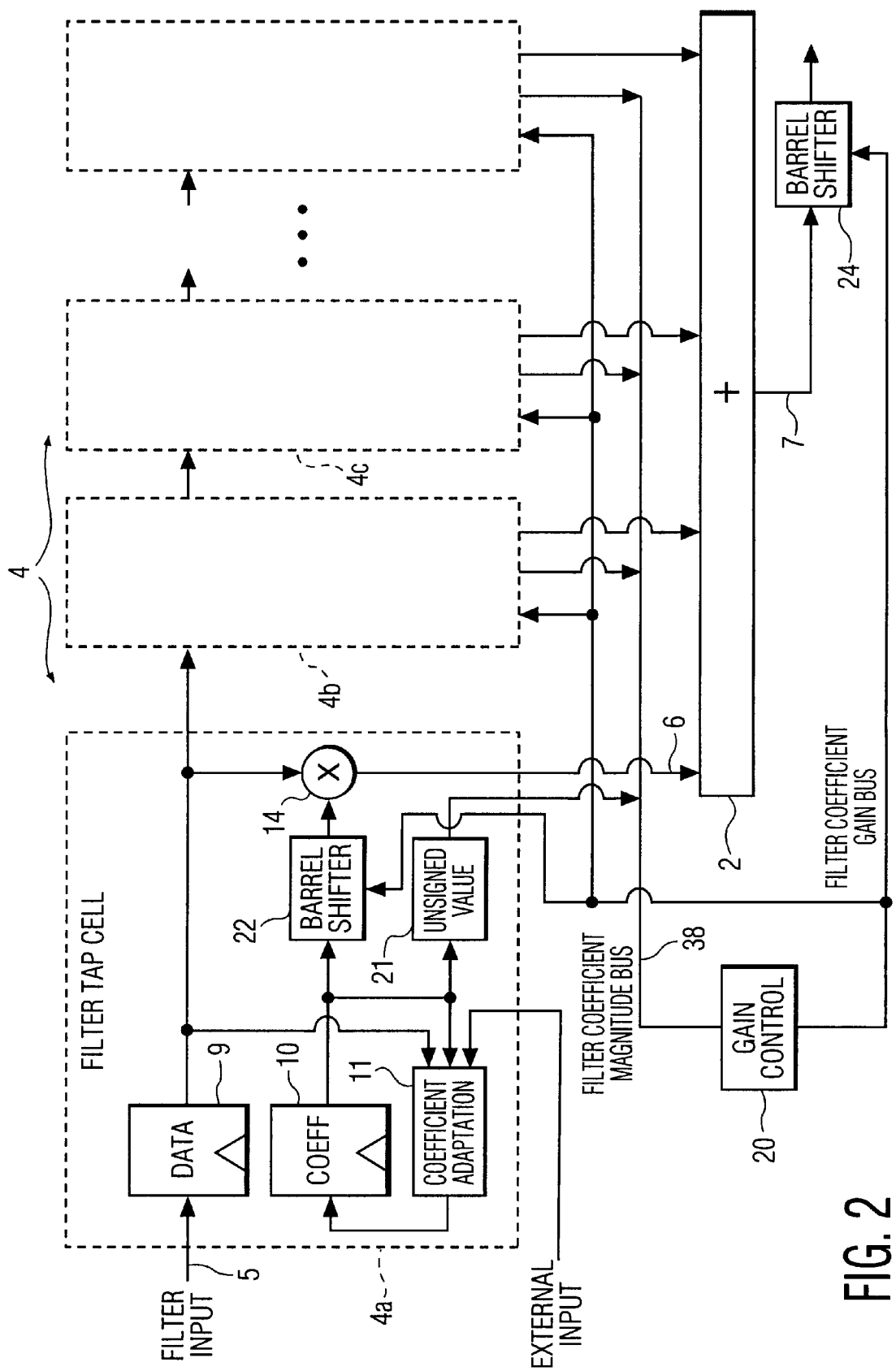
FIG. 2 is a block diagram showing circuitry which may be used to implement the functions shown in FIG. 1.

In the invention, the gain introduced by gain adjusting circuit 12 is variable in response to changes in the filter coefficients. In this regard, FIG. 2 shows specific circuitry, namely gain control circuit 20 and unsigned value circuit 21, which is used to determine the gain. FIG. 2 also shows a representative circuit architecture that is used to perform the other functions described above with respect to FIG. 1. Specifically, FIG. 2 shows barrel shifter 22, which performs the function of gain adjusting circuit 12, and barrel shifter 24, which performs the function of inverse gain circuit 3. A detailed description of the operation of these features is provided below.

More specifically, barrel shifter 22 applies a gain to a coefficient output from coefficient register 10. As is well known in the art, a barrel shifter, such as barrel shifter 22, can provide any amount of gain that corresponds to a power of two. The amount of gain to be applied by barrel shifter 22 is determined by gain control circuit 20. In this regard, since all filter coefficients are enhanced by the same gain in this embodiment of the invention, gain control circuit 20 determines the gain based on the highest order nonzero magnitude bit in the coefficients of filter cells 4. That is, since barrel shifter 22 shifts bits in the coefficient so that the highest order nonzero magnitude bit in the coefficient is one, gain control circuit 22 determines the amount of bit shift which is to be performed on all coefficients based on the amount of bits that a coefficient having a highest order nonzero magnitude bit can be shifted without affecting its value. For example, if the coefficients comprise unsigned "00001101", "00110011", and "00000011", gain control circuit 20 will identify "00110011" as having the highest order nonzero magnitude bit, and thus select a gain which will shift that coefficient, as well as the other two coefficients by two zeros to the left (since there are zeros in the 128's and 256's positions of the "00110011" coefficient). Specific circuitry for effecting this operation is described below.

Since the coefficients are represented by binary numbers, in a case where there are no sign values in the coefficients (i.e., all the coefficients are positive), the task of locating a coefficient having a highest order nonzero bit comprises merely finding the highest-order nonzero bit among all of the coefficients in filter 1. In cases where the coefficients have sign values, and are represented using conventional two's complement format, the complexity of this task is increased due to the presence of a sign bit in the most significant bit ("MSB") position. Accordingly, the present invention provides unsigned value circuit 21 to address the problem of the sign bit. In operation, unsigned value circuit 21 obtains a coefficient from coefficient register 10, and then determines the magnitude (i.e., the absolute value) of the coefficient by a bitwise inversion of the coefficient in a case that a sign bit for the coefficient indicates that the coefficient is a negative number.

Figure 3:
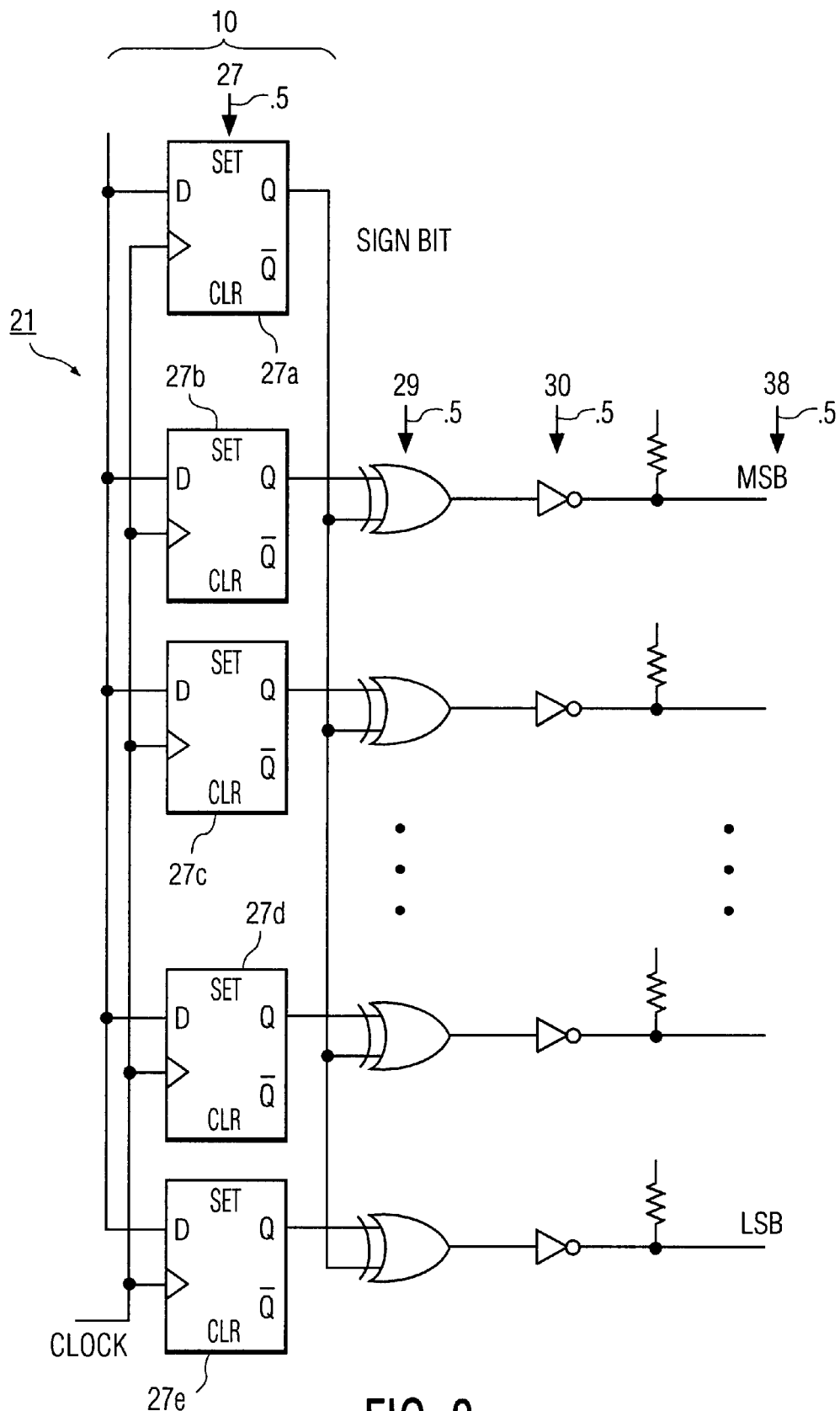
FIG. 3 is a circuit diagram showing a standard way to implement the unsigned value circuit shown in FIG. 2, together with flip flops from the coefficient register shown in FIG. 1.

In this regard, unsigned value circuit 21 may include standard logic elements to perform the bitwise inversion of magnitude bits (i.e., non-sign bits) for the coefficient described above. FIG. 3 shows such an implementation. That is, FIG. 3 shows an implementation of unsigned value circuit 21 using exclusive-OR gates 29 and inverters 30. In operation, exclusive-OR gates 29 output the magnitude of the data stored in flip flops 27 (which comprise coefficient register 10) by virtue of an exclusive-OR operation performed between the sign bit stored in flip flop 27a and the magnitude bits stored in flip flops 27b to 27e. In this embodiment, inverters 30 are provided so as to invert the magnitude of the data output from exclusive-OR gates 29. This is done because, in the present embodiment of the invention, coefficient magnitude bus 38 is an "active-low" bus, as opposed to an "active-high" bus. In cases where an active-high bus is used, no inverters would be required.

As shown in FIG. 3, since the filter coefficients are stored in coefficient register 10 using standard flip flops 27, each flip flop will have both an uncomplemented and a complemented coefficient data output. Consequently, exclusive-OR gates 29 may be replaced by a two-to-one multiplexer (not shown), which selects between two outputs according to a value of a sign bit. Such a multiplexer may be implemented using conventional logic gates or, alternatively, may be implemented using two pass transistors in the manner shown in FIG. 4.

Figure 4:
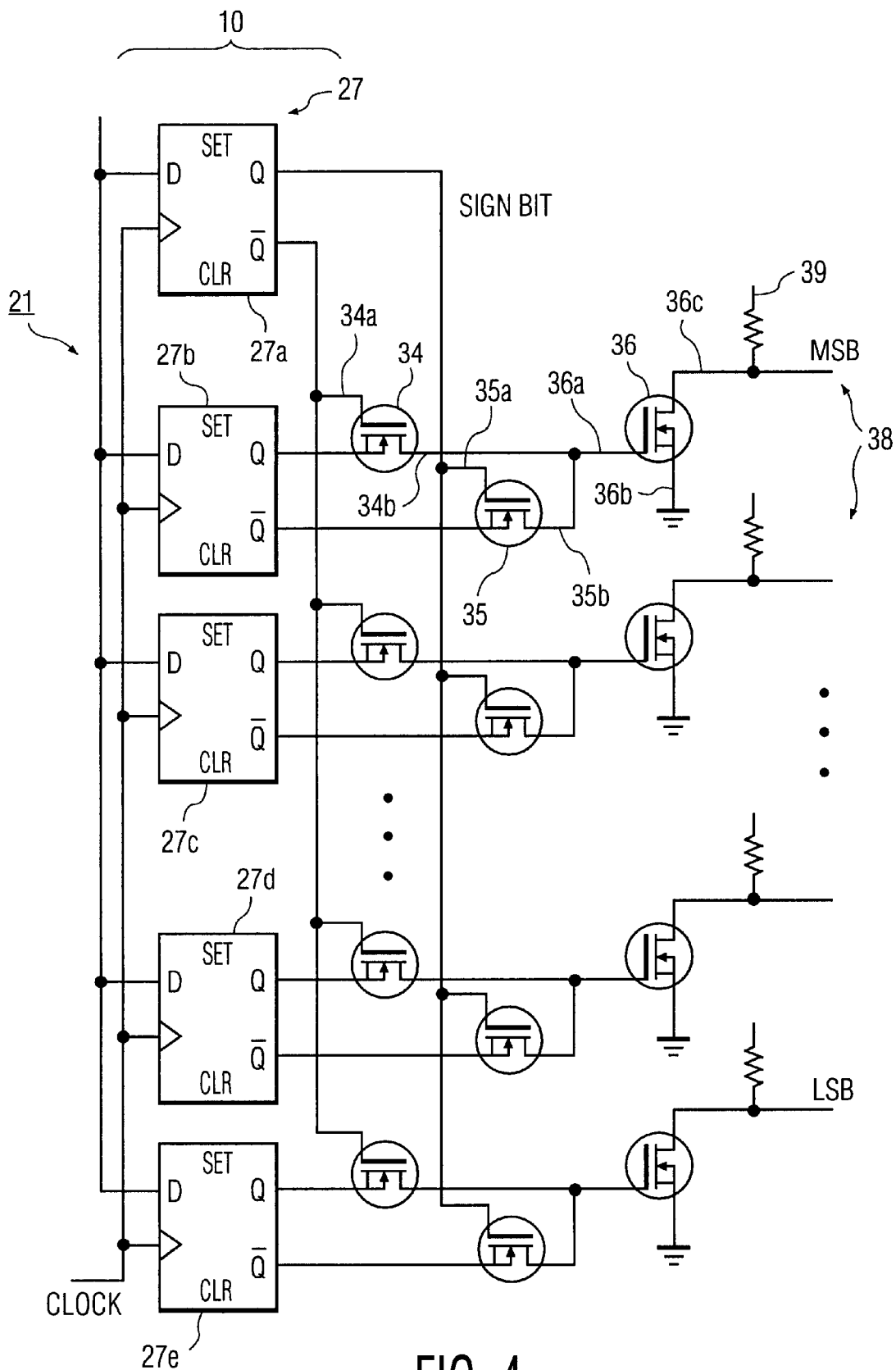
FIG. 4 is a circuit diagram showing an alternative way to implement the unsigned value circuit shown in FIG. 2, together with flip flops from the coefficient register shown in FIG. 1.

In this regard, FIG. 4 shows a two-pass-transistor implementation of unsigned value circuit 21, together with flip flops 27 from coefficient register 10. Taking transistors 34, 35 and 36 as examples, gate 34a of transistor 34 is connected to the complemented sign bit output of flip flop 27a, and gate 35a of transistor 35 is connected to the uncomplemented sign bit output of flip flop 27a. Drains 34b and 35b of transistors 34 and 35, respectively, are connected together in the configuration shown in FIG. 4, so as to form a node that is always connected to one of the outputs of flip flop 27b. Which output the node is connected to depends upon the coefficient's sign bit stored in flip flop 27a. A magnitude bit (in this case, the MSB) may then be output from flip flop 27b to coefficient bus 38 (see FIG. 2) via this node. Specifically, the magnitude bit is output via gate 36a of transistor 36 having source 36b that is grounded and drain 36c that is connected to all other drains on coefficient magnitude bus 38 and to pull-up-resistor 39. The remaining magnitude bits that are stored in flip flops 27c to 27e are also output to coefficient magnitude bus 38 in this manner.

Figure 5:
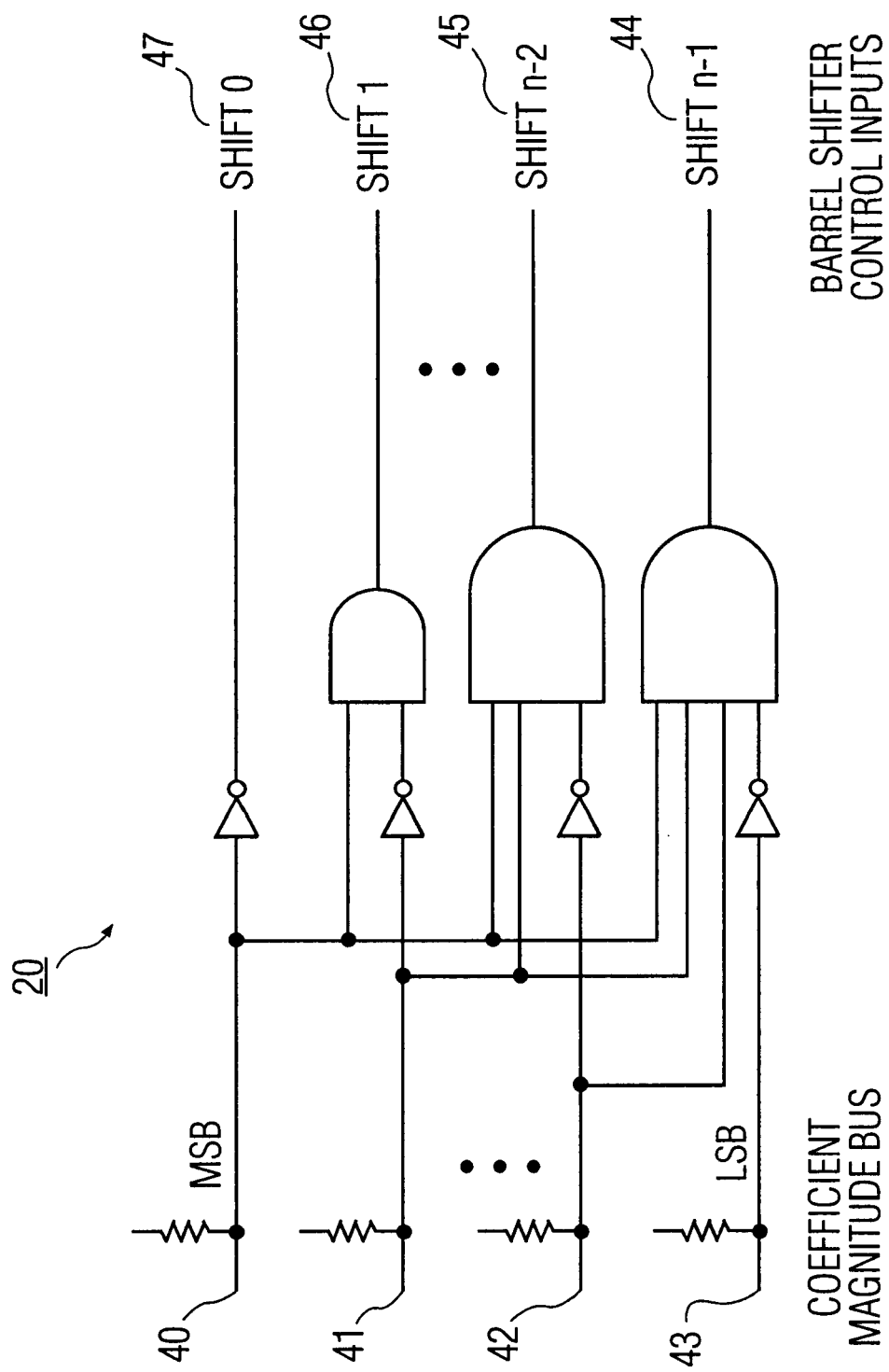
FIG. 5 shows circuitry used to implement the gain control circuit shown in FIG. 2.

Thus, following processing by unsigned value circuit 21, an unsigned coefficient is output to coefficient magnitude bus 38. Determination of the highest order bit of this coefficient is then performed by gain control circuit 20, which can comprise a priority encoder or the like. Specifically, gain control circuit 20 determines a coefficient value having a highest order nonzero bit, and thus the number of bits by which all coefficients, as well as the filter output, must be shifted. FIG. 5 shows circuitry which may be used to implement gain control circuit 20 in this embodiment of the invention.

In this regard, as shown in FIG. 5, gain control circuit 20 includes a plurality of AND gates and inverters, into which are input binary coefficient data output from unsigned value circuit 21. The logic gates shown in FIG. 5 are configured to ensure that, for any input, a single "1" is output, together with a plurality of "0's". The "Shift" line on which the single "1" is output corresponds the amount of shift required for the input coefficient. For example, for "Shift 0", no bits are to be shifted, for "Shift 1", the bits are to be shifted one to the left, for "Shift 2", the bits are to be shifted two to the left, and so on.

The case of a negative coefficient having an inverted magnitude of "0001", in which "0" is the MSB and "1" is the least significant bit ("LSB"), can be used to illustrate the operation of the circuit shown in FIG. 5. More specifically, in this case "0001" is input to ports 40, 41, 42 and 43. As a result, the output of "Shift 0" is "1", and the outputs of "Shift 1", "Shift 2", and "Shift 3" are all "0's". Since the "0001" is inverted, as described above, the actual value of the coefficient in this case is really "1110". Thus, a "1" at "Shift 0", which means that no shift of the data is to be performed, is correct since bits in "1110" should not be shifted. Table 1 shown below provides examples of inputs to gain control circuit 20 for four-bit, nonzero coefficients, and corresponding shift outputs produced thereby.

TABLE 1

| Input Coefficient (Inverted) | Actual Coefficient | Shift 0 | Shift 1 | Shift 2 | Shift 3 |
| --- | --- | --- | --- | --- | --- |
| 0000 | 1111 | 1 | 0 | 0 | 0 |
| 0001 | 1110 | 1 | 0 | 0 | 0 |
| 0010 | 1101 | 1 | 0 | 0 | 0 |
| 0011 | 1100 | 1 | 0 | 0 | 0 |
| 0100 | 1011 | 1 | 0 | 0 | 0 |
| 0101 | 1010 | 1 | 0 | 0 | 0 |
| 0110 | 1001 | 1 | 0 | 0 | 0 |
| 0111 | 1000 | 1 | 0 | 0 | 0 |
| 1000 | 0111 | 0 | 1 | 0 | 0 |
| 1001 | 0110 | 0 | 1 | 0 | 0 |
| 1010 | 0101 | 0 | 1 | 0 | 0 |
| 1011 | 0100 | 0 | 1 | 0 | 0 |
| 1100 | 0011 | 0 | 0 | 1 | 0 |
| 1101 | 0010 | 0 | 0 | 1 | 0 |
| 1110 | 0001 | 0 | 0 | 0 | 1 |

Gain control circuit 20 also includes circuitry (not shown) to determine the highest-order nonzero bit in the coefficients of digital filter 1 based on the shift amounts output from the circuit shown in FIG. 5. For example, the shift amounts for all coefficients in digital filter 1 can be logically "OR-ed" in order to find the shift amount for all coefficients in the filter.

As an alternative to the circuitry described above, in a case that coefficients in the filter all have positive values, (i.e., there are no sign bits), the coefficients may simply be output from coefficient register 10 to coefficient magnitude bus 38 without going through unsigned value circuit 21. Thereafter, gain control circuit 20, which in this case may simply comprise plurality of "OR" gates, finds the highest-order nonzero bit by performing a logical OR operation on same order bits from each coefficient. The bit shift amount corresponding to a coefficient having a highest-order non-zero bit is then selected and output based on this operation. One method of implementing this logical OR operation, as well as that described above, is through a distributed means, such as a "wired-OR" of the bits (or a "wired-AND" of the inverted bits).

Once a bit shift amount (i.e., a gain) has been determined, the bit shift amount is then provided to barrel shifters 22 and 24, as shown in FIG. 2. In this regard, as noted above, coefficients in filter cells 4 are shifted by the same amount. Accordingly, as shown in FIG. 2, the shift amount is provided to each of shift cells 4. Barrel shifter 22 attenuates a coefficient provided from coefficient register 10 by the bit shift amount provided from gain control circuit 20. That is, barrel shifter 22 shifts the coefficient provided from coefficient register 10 left by an amount equal to the bit shift amount provided by gain control circuit 20. As described above, this results in the elimination of unnecessary bits from the coefficient and thus permits a multiplication circuit having a smaller dynamic range to be used in each filter cell.

After a coefficient from coefficient register 10 has been adjusted by the requisite shift amount, that "adjusted" coefficient is then multiplied by an input data value from data register 9. The output of this multiplication comprises the filter cell output 6, and is provided to adder circuit 2. In preferred embodiments of the invention, the shift amount (i.e., the gain) is selected so that the adjusted coefficient in each filter cell occupies an entire input range of the multiplier circuit for that filter cell. Thus, in the case that an eight-bit multiplier is used, in these embodiments of the invention, the gain should be selected so as to ensure that there are eight bits of coefficient data provided to the multiplier circuit. This can be implemented in gain control circuit 20 by including circuitry therein to perform sign extension by adding zeros for positive numbers or ones for negative numbers to unoccupied high order bit positions of coefficient values that do not have the requisite number of bits.

As described above, adder circuit 2 adds filter cell outputs from all of filter cells 4 in order to generate filter output 7 for digital filter 1. Thereafter, barrel shifter 24 shifts the filter output, i.e., the sum of the outputs of filter cells 4, by a gain which is the inverse of that used by barrel shifter 22. That is, barrel shifter 24 performs sign extension on the filter output so as to maintain a necessary bit precision of the filter. For example, if the barrel shifters in filter cells 4 (e.g., barrel shifter 22) remove three most significant bits from the filter coefficients, barrel shifter 24 adds three sign extension bits to the high order bit positions of filter output 7.

Figure 6:
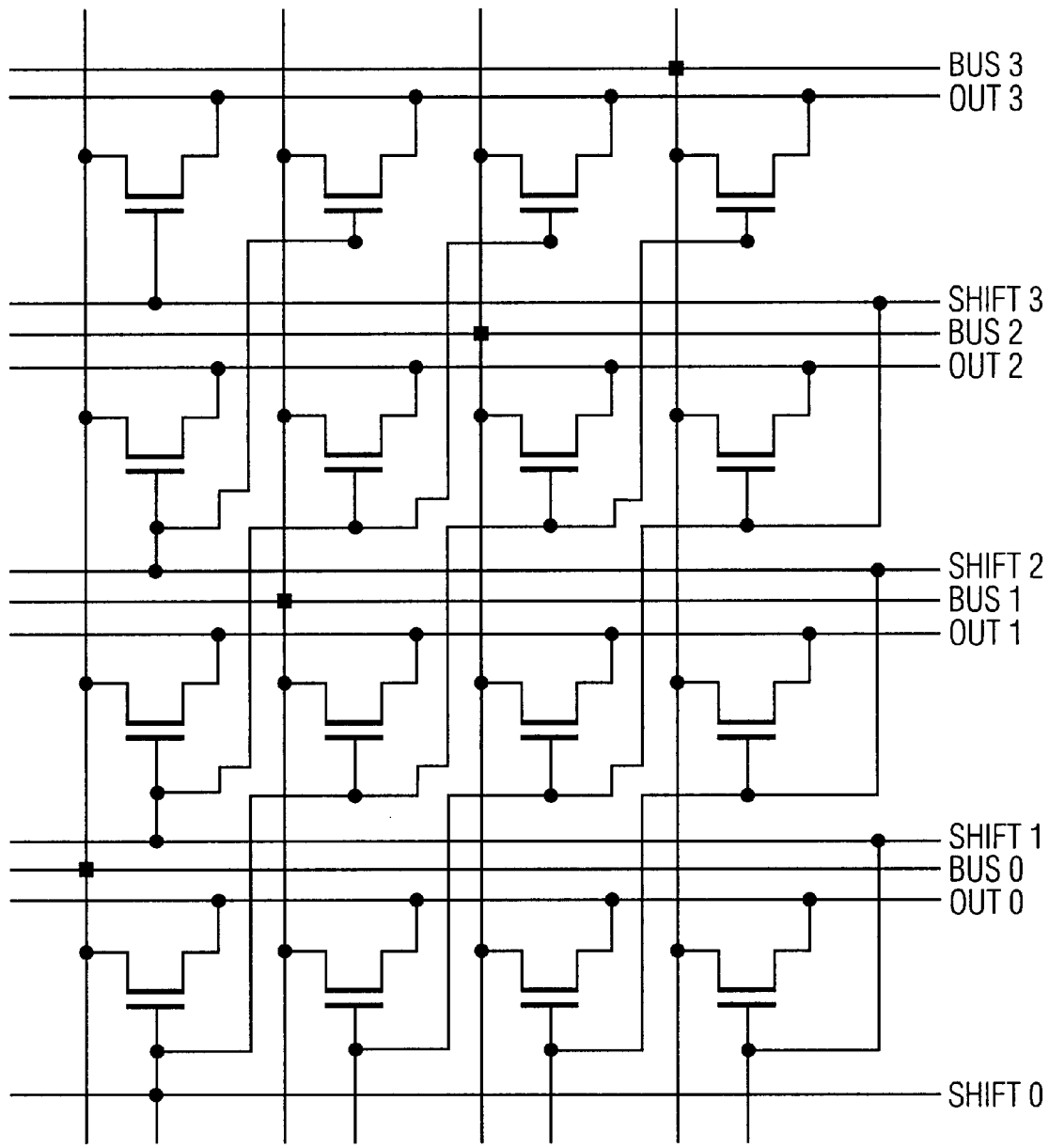
FIG. 6 shows implementation of a barrel shifter using a matrix of pass transistors.

Barrel shifters 22 and 24 may be implemented using standard digital logic gates. However, due to the large number of logic gates required in logic gate configurations, the present invention preferably implements barrel shifters 22 and 24 using a matrix of pass transistors. An example of well-known barrel shifter configuration using a matrix of pass transistors is shown in FIG. 6. By using a barrel shifter configured in the manner shown in FIG. 6, the invention is able to reduce even further the amount of hardware required to implement digital filter 1. This, in turn, reduces signal propagation delay, thereby increasing the speed of digital filter 1.

Second Embodiment

Figure 7:
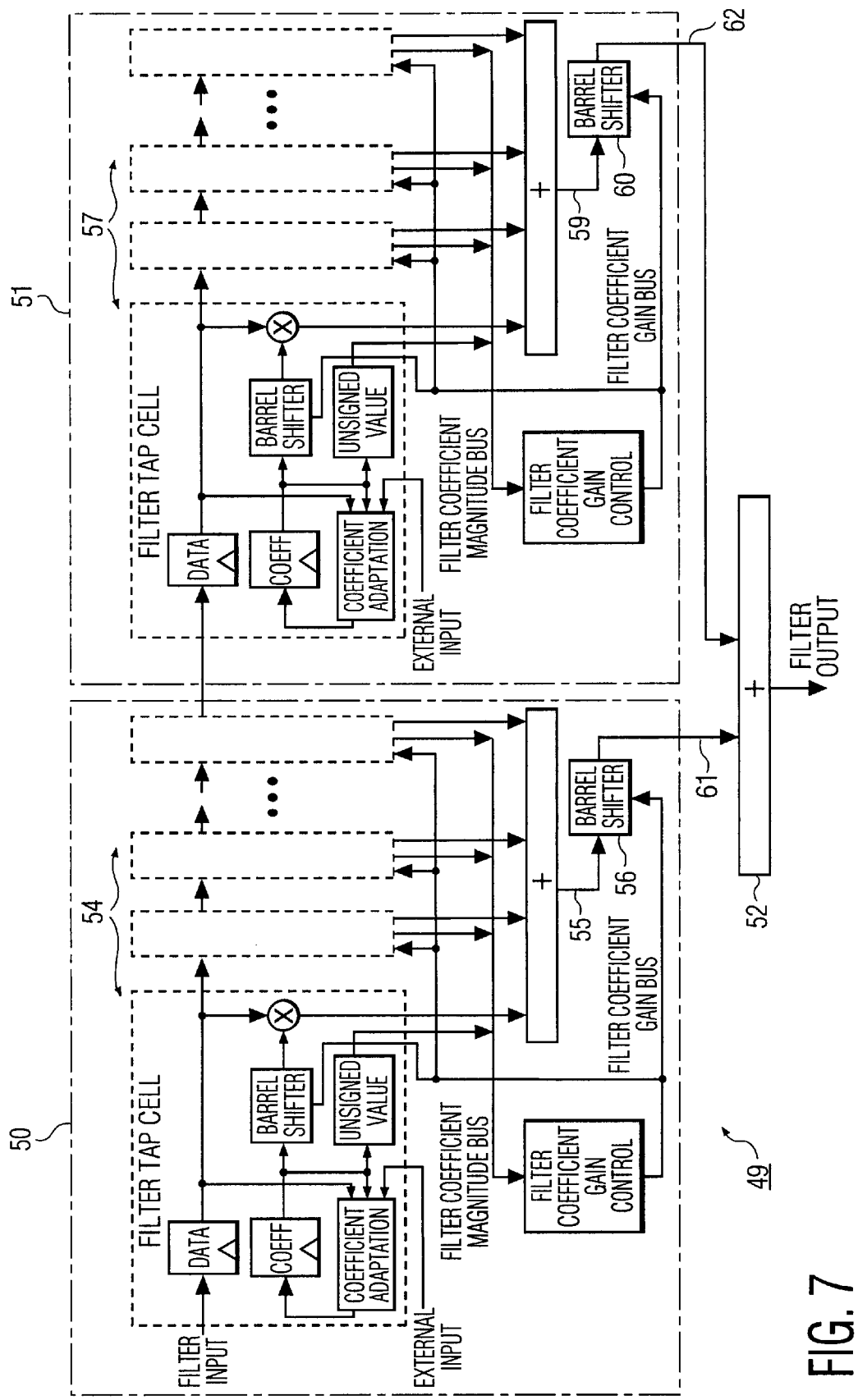
FIG. 7 shows a second embodiment of a digital filter in accordance with the present invention.

A second embodiment of a digital filter in accordance with the present invention is shown in FIG. 7. This embodiment is a digital filter which includes a first plurality of filter cells, each of which includes circuitry to determine a coefficient for the filter cell, to adjust the coefficient in accordance with a first gain that is used by each of the first plurality of filter cells, and to multiply input data by the adjusted coefficient in order to generate a first filter cell output. A first adder circuit generates a first output by adding first filter cell outputs from each of the first plurality of filter cells, and a first inverse gain circuit generates a first adjusted output by adjusting the first output in accordance with an inverse of the first gain used to adjust the coefficients of the first plurality of filter cells. Also included in the digital filter are a second plurality of filter cells, each of which includes circuitry to determine a coefficient for the filter cell, to adjust the coefficient in accordance with a second gain that is used by each of the second plurality of filter cells, and to multiply input data by the adjusted coefficient in order to generate a second filter cell output. A second adder circuit generates a second output by adding second filter cell outputs from each of the second plurality of filter cells, and a second inverse gain circuit generates a second adjusted output by adjusting the second output in accordance with an inverse of the second gain used to adjust the coefficients of the second plurality of filter cells. Finally, a third adder circuit adds the first adjusted output and the second adjusted output in order to generate a filter output for the digital filter.

Thus, with reference to FIG. 7, digital filter 49 includes first filter circuit 50 and second filter circuit 51, both of which are identical in structure and function to digital filter 1 shown in FIG. 2. Digital filter 49 also includes adder circuit 52, which adds outputs from the first and second filter circuits. Using the circuit configuration shown in FIG. 7, it is possible to increase the overall precision of the digital filter.

More specifically, in accordance with the invention, a first gain (i.e., a first shift amount) can be determined for first filter circuit 50. This first gain can then be used to adjust coefficients in each of first filter cells 54 in first filter circuit 50. Thereafter, an inverse of the first filter gain can then be used to adjust first filter output 55 using a first inverse gain circuit such as barrel shifter 56. A second gain (i.e., a second shift amount), which may be the same or different from the first gain, can be determined for second filter circuit 51. This second gain can then be used to adjust coefficients in each of second filter cells 57 in second filter circuit 51. Thereafter, an inverse of the second filter gain can then be used to adjust second filter output 59 using a second inverse gain circuit such as barrel shifter 60. Adjusted outputs 61 and 62 are then added using adder circuit 52 in order to generate an output for digital filter 49.

By using different gains for different parts of a filter, this embodiment of the invention makes it possible to attenuate coefficients in different groups of filter cells differently. This can lead to a further reduction in the amount of hardware needed to implement the digital filter for a given overall filter precision. For example, in the case of a ten-filter cell, coefficients in the first five cells may have more excess zeros in high order bit positions than the second five filter cells. Thus, for example, coefficients in the first five filter cells may be adjusted so that these cells can use an eight-bit multiplier and coefficients in the second five cells may be adjusted so that these cells can use a sixteen-bit multiplier. Since an eight-bit multiplier requires less hardware to implement than a sixteen-bit multiplier, and can be used for five of the ten filter cells, the overall size of the digital filter can be decreased even further relative to that of its conventional counterparts.

Third Embodiment

Figure 8:
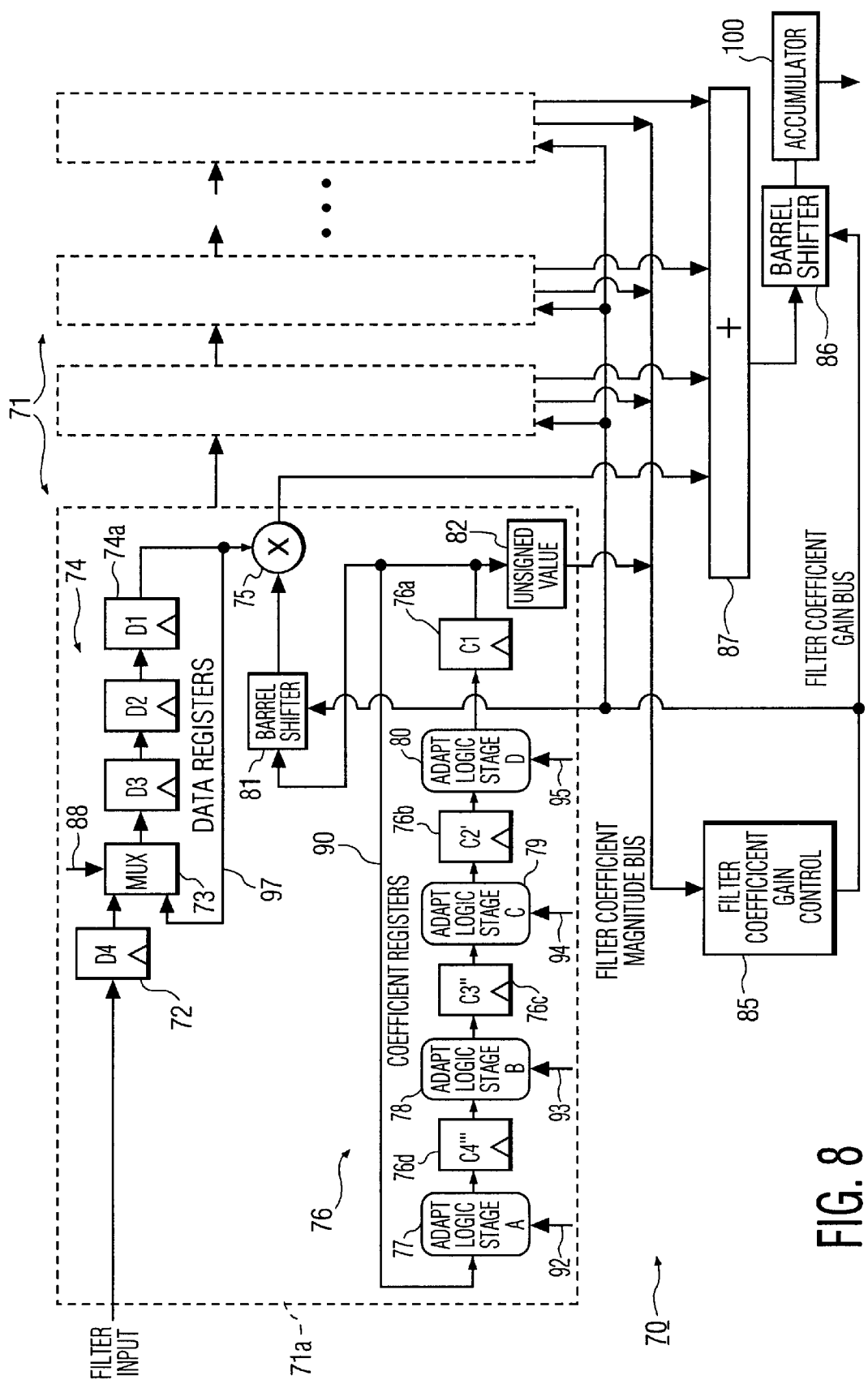
FIG. 8 shows a third embodiment of a digital filter in accordance with the present invention.

A third embodiment of a digital filter in accordance with the present invention is shown in FIG. 8. Specifically, this embodiment is a digital filter which includes a plurality of filter cells, each of which includes circuitry to determine a plurality of coefficients for the filter cell, to adjust each of the plurality of coefficients in accordance with a gain that is used by each of the plurality of filter cells, and to multiply a plurality of data values input to the filter cell by corresponding adjusted coefficients in order to generate a filter cell output. In the invention, an adder circuit generates a filter output by adding filter cell outputs from each of the plurality of filter cells, and an inverse gain circuit adjusts the filter output in accordance with an inverse of the gain used to adjust the coefficients of the plurality of filter cells.

The subject embodiment of the invention combines the advantages of the first embodiment described above with the advantages of resource sharing in a single filter cell. In general, resource sharing refers to sharing hardware circuitry, most often a multiplier circuit, within a single filter cell so as to reduce the overall amount of hardware required to implement the filter and, consequently, to reduce the size of the filter. In this regard, the invention may be implemented in a conventional resource sharing arrangement, in which multiplexers are used in a filter cell in order to multiply different filter coefficients by different data values using the same multiplication circuit. Alternatively, the invention may be implemented in the resource sharing system described in U.S. patent application Ser. No. 09/031, 698, entitled "System For Sharing Resources In A Digital Filter" (Assignee: Philips Electronics North America Corp.; Inventors: Karl Wittig and Gene Turkenich) filed Feb. 27, 1998, now U.S. Pat. No. 6,108,681, the contents of which are hereby incorporated by reference into the subject application as if set forth herein in full.

In this regard, in the resource sharing system described in U.S. patent application Ser. No. 09/031,698, each filter cell stores more than one input data value and more than one coefficient, but uses a single multiplier circuit to multiply coefficients by data values. Moreover, each of these filter cells uses the same adaptation circuitry to update plural coefficient values, thereby further reducing the amount of hardware required in the filter. FIG. 8 shows an example of a digital filter in accordance with this embodiment of the invention. Specifically, FIG. 8 shows a digital filter which implements both resource sharing and coefficient dynamic range varying of the type described above in the first two embodiments. As shown in FIG. 8, filter 70 includes filter cells 71. Each of these filter cells includes an input register 72, a multiplexer 73, data registers 74, a multiplier circuit 75, coefficient registers 76, logic stages 77, 78, 79 and 80, barrel shifter 81, and unsigned value circuit 82.

Barrel shifter 81 and unsigned value circuit 82 operate in the same manner as barrel shifter 22 and unsigned value circuit 21 described above with respect to FIG. 2. The same is true of gain control circuit 85, barrel shifter 86, and adder circuit 87, which are also shown in FIG. 8. That is, these components operate in substantially the same manner as gain control circuit 20, barrel shifter 24, and adder circuit 2 described above with respect to FIG. 2. Detailed descriptions of these components are therefore here omitted for the sake of brevity. It is worth noting, however, that, in the example shown in FIG. 8, adder 87 must operate four times faster than adder 2, since adder 87 is receiving filter outputs at four times the rate that adder 2 receives filter outputs. In this regard, in general, in a case that there are "N" filter coefficients per filter cell, in the third embodiment, the adder must operation "N" times as fast as adder 2 of the first embodiment. Moreover, this embodiment of the invention includes accumulator 100, which adds the outputs of the filter cells together, stores the sum of the products, and outputs the sum of the products in response to a clock pulse.

The remaining components shown in FIG. 8 enable sharing of both multiplier circuit 75 and coefficient circuitry used to update coefficients in coefficient registers 76. To this end, input register 72 is arranged in series with multiplexer 73 and data registers 74. Both input register 72 and data registers 74 can comprise conventional shift registers, which shift data in response to a clock signal. In this regard, as described in more detail below, input register 72 shifts data in response to the sampling clock signal noted above. In contrast, data registers 74 shift data in response to a circulation clock signal, which has a frequency that is a multiple of the frequency of the sampling clock signal. This arrangement provides for multiple shifting of each of data registers 74 for every single shift of input register 72.

Data register 74a outputs a data value to multiplier circuit 75 at each circulation clock pulse. As shown in FIG. 8, that same data value is fed back to multiplexer 73 via feedback path 97. Multiplexer 73 also receives selection signal 88 and an output from input register 72. Selection signal 88 causes multiplexer 73 to shift data from register 72 during sampling clock pulses, and causes multiplexer 73 to shift data from feedback path 97 during circulation clock pulses. By virtue of this arrangement, during circulation clock pulses, data values circulate within data registers 74. However, at each sampling clock pulse, an additional data value from input register 72 is shifted into data registers 74, where the additional data value is circulated. Thus, to summarize, data registers 74 circulate a first set of data values for a predetermined time, and, following the predetermined time, data registers 74 circulate a second set of data values (which includes the additional data value) for the predetermined time, and so on.

In this regard, data registers 74 are designed to circulate the same number of data values. Accordingly, each time an additional data value is input into data registers 74, one of the data values already within data registers 74 is removed. Specifically, the data value in feedback path 97 (i.e., the data value which was last output to multiplier circuit 75) is removed, since that data value is not input back into data registers 74. Since only one data value is removed per sampling clock period, data registers 74 generally circulate a data value for a plurality of sampling clock periods before that data value is removed. The exception to this general rule is the case in which a single data value is circulated in a single data register. In this case, the data value only needs to be circulated for one sampling clock period.

Coefficient registers 76 are arranged to circulate a plurality of coefficient values that correspond to a plurality of coefficients, so that each of the plurality of coefficient values is output once during a predetermined period. More specifically, coefficient values are shifted among coefficient registers 76 such that, at a predetermined period, which preferably corresponds to a period of the circulation clock signal, coefficient register 76a outputs a coefficient to barrel shifter 81. In turn, barrel shifter 81 summarily adjusts that coefficient in accordance with a gain received from gain control circuit 85, and outputs the adjusted coefficient to multiplier circuit 75. Thus, at each period of the circulation clock signal, multiplier circuit 75 receives a data value from data register 74a and an adjusted coefficient from barrel shifter 81. At this time, multiplier circuit 75 multiplies these two values to generate and output a product. It is noted that although a multiplier circuit is described, any type of circuit may be used in the embodiments of the invention described herein depending, of course, upon the type of filter cell in which the invention is implemented, among other things.

Regarding coefficient registers 76, as shown in FIG. 8, coefficient registers 76 circulate coefficient values by feeding a coefficient output to barrel shifter 81 back along feedback path 90. This arrangement permits the same coefficients to circulate among coefficient registers 76, thereby making it possible for those coefficients to be shared by data values in data registers 74. That is, as described above, data registers 74 circulate a data value for a plurality of sampling clock periods before that data value is removed. As a result, the same data value is output several times to multiplier circuit 75 over several sampling clock signal periods. Each time that the same data value is output to multiplier circuit 75, a different coefficient value is output thereto via barrel shifter 81. As a result, each data value is multiplied by each coefficient.

In the preferred embodiment of the invention shown in FIG. 8, a plurality of logic stages 77, 78, 79 and 80 are arranged among coefficient registers 76. These logic stages receive external inputs 92, 93, 94 and 95, respectively, and, if necessary, calculate updated coefficients values corresponding to coefficients output by coefficient registers 76. More specifically, as noted above, filter cell 71a is an adaptive filter cell, meaning that coefficients therein may be updated periodically to correct unwanted changes in the data values caused, e.g., by changes in the transmission channel or the like. In the present invention, these updates are made via logic stages 77 to 80, where external inputs 92 to 95 can comprise filter error (i.e., a difference between expected and actual filter outputs) or the like.

Thus, in the present invention, coefficient computation is "broken up" into separate pipe-line stages, each of which is performed between appropriate coefficient registers. Accordingly, in these embodiments of the invention, coefficient values in coefficient registers 76b, 76c and 76d do not necessarily comprise actual coefficients, hence the "prime" indications on C2, C3 and C4. Rather, the coefficient values in these coefficient registers may represent intermediate values of the computation of the actual coefficients. This feature of the invention is advantageous, since it allows coefficient circulating and updating to be performed simultaneously, thereby further reducing the amount of hardware required to implement filter cell 71a.

In preferred embodiments of the invention, logic stages 77 to 80 update the coefficients using the well-known least-mean-squares algorithm. However, it is noted that the invention is not limited to updating the coefficients using this algorithm, and that any such algorithm may be used.

Thus, except for the resource sharing aspect described above, and minor timing considerations, the third embodiment of the invention operates in a manner which is similar to that of the first embodiment. In this regard, it is noted that the second embodiment of the invention can also be implemented using filter cells that implement resource sharing of the type described in the third embodiment. In such an embodiment, it is possible to achieve substantial overall hardware reductions in the digital filter, without reducing the filter's speed of operation.

The present invention has been described with respect to particular illustrative embodiments. It is to be understood that the invention is not limited to the above-described embodiments and modifications thereto, and that various changes and modifications may be made by those of ordinary skill in the art without departing from the spirit and scope of the appended claims.

What is claimed is:

1. A digital filter comprising:
   a plurality of filter cells, each of the plurality of filter cells including circuitry to determine a coefficient for the filter cell, to adjust the coefficient in accordance with a gain that is used by each of the plurality of filter cells, and to multiply input data by the adjusted coefficient in order to generate a filter cell output;
   an adder circuit which generates a filter output by adding filter cell outputs from each of the plurality of filter cells; and
   an inverse gain circuit which adjusts the filter output in accordance with an inverse of the gain used to adjust the coefficients of the plurality of filter cells.

2. A digital filter according to claim 1, further comprising a gain control circuit to determine the gain based on a coefficient of the plurality of filter cells having a highest order nonzero magnitude bit.

3. A digital filter according to claim 2, wherein each of the plurality of filter cells includes a multiplier circuit to multiply the input data by the adjusted coefficient; and
   wherein the gain is determined so that the adjusted coefficient in each filter cell occupies an input range of the multiplier circuit for the filter cell.

4. A digital filter according to claim 3, wherein each of the plurality of filter cells includes a gain adjusting circuit which adjusts the coefficient for the filter cell by shifting bits comprising the coefficient such that in the filter cell having a largest coefficient from among the plurality of filter cells a highest order nonzero bit of the coefficient is in a most significant bit position of an input to the multiplier circuit.

5. A digital filter according to claim 4, wherein the gain adjusting circuit comprises a barrel shifter.

6. A digital filter according to claim 5, wherein the barrel shifter is implemented using a matrix of pass transistors.

7. A digital filter according to claim 2, wherein each of the plurality of filter cells comprises a coefficient adaptation circuit to determine the coefficient for the filter cell, the adaptation circuit updating the coefficient periodically based on data relating to the input data.

8. A digital filter according to claim 7, wherein the gain control circuit varies the gain in accordance with updates in coefficients for the plurality of filter cells.

9. A digital filter according to claim 1, wherein the inverse gain circuit comprises a barrel shifter.

10. A method of filtering input data using a digital filter comprised of a plurality of filter cells, each of the plurality of filter cells for generating a filter cell output based on input data and a coefficient, the method comprising the steps of:
    a coefficient determining step for determining a coefficient of each of the plurality of filter cells;
    a coefficient adjusting step for adjusting the coefficient of each filter cell in accordance with a gain that is used by each of the plurality of filter cells;
    a multiplying step for multiplying input data in each filter cell by an adjusted coefficient so as to generate a filter cell output for each filter cell;
    an adding step for adding filter cell outputs from each of the plurality of filter cells so as to generate a filter output; and
    an output adjusting step for adjusting the filter output in accordance with an inverse of the gain used to adjust the coefficients of the plurality of filter cells.

11. A method according to claim 10, further comprising a gain determining step for determining the gain that is used by each of the plurality of filter cells based on a coefficient of the plurality of filter cells having a highest order nonzero magnitude bit.

12. A method according to claim 11, wherein the multiplying step is performed in each of the plurality of filter cells using a multiplier circuit which multiplies input data by an adjusted coefficient; and
    wherein the gain determining step determines the gain so that the adjusted coefficient in each filter cell occupies an input range of the multiplier circuit for the filter cell.

13. A method according to claim 12, wherein the coefficient adjusting step adjusts the coefficient for the filter cell by shifting bits comprising the coefficient such that in the filter cell having a largest coefficient from among the plurality of filter cells a highest order nonzero bit of the coefficient is in a most significant bit position of an input to the multiplier circuit.

14. A method according to claim 13, wherein the coefficient adjusting step is performed using a barrel shifter.

15. A method according to claim 14, wherein the barrel shifter is implemented using a matrix of pass transistors.

16. A method according to claim 11, wherein the coefficient determining step determines the coefficient for each filter cell by updating the coefficient periodically based on data relating to input data for the filter cell.

17. A method according to claim 16, wherein the gain determining step varies the gain in accordance with updates in coefficients for the plurality of filter cells.

18. A method according to claim 10, wherein the output adjusting step is performed using a barrel shifter.

19. A digital filter comprising:
    a first plurality of filter cells, each of the first plurality of filter cells including circuitry to determine a coefficient for the filter cell, to adjust the coefficient in accordance with a first gain that is used by each of the first plurality of filter cells, and to multiply input data by the adjusted coefficient in order to generate a first filter cell output;
    a first adder circuit which generates a first output by adding first filter cell outputs from each of the first plurality of filter cells;
    a first inverse gain circuit which generates a first adjusted output by adjusting the first output in accordance with an inverse of the first gain used to adjust the coefficients of the first plurality of filter cells;
    a second plurality of filter cells, each of the second plurality of filter cells including circuitry to determine a coefficient for the filter cell, to adjust the coefficient in accordance with a second gain that is used by each of the second plurality of filter cells, and to multiply input data by the adjusted coefficient in order to generate a second filter cell output;
    a second adder circuit which generates a second output by adding second filter cell outputs from each of the second plurality of filter cells;
    a second inverse gain circuit which generates a second adjusted output by adjusting the second output in accordance with an inverse of the second gain used to adjust the coefficients of the second plurality of filter cells; and a third adder circuit which adds the first adjusted output and the second adjusted output in order to generate a filter output for the digital filter.

20. A digital filter comprising:

a plurality of filter cells, each of the plurality of filter cells including circuitry to determine a plurality of coefficients for the filter cell, to adjust each of the plurality of coefficients in accordance with a gain that is used by each of the plurality of filter cells, and to multiply a corresponding data value input to the filter cell by a corresponding adjusted coefficient in order to generate to generate a filter cell output;

an adder circuit which generates a filter output by adding filter cell outputs from each of the plurality of filter cells; and an inverse gain circuit which adjusts the filter output in accordance with an inverse of the gain used to adjust the coefficients of the plurality of filter cells.

* * * * *